United States Patent [19]
Zhou et al.

[11] Patent Number: 6,117,777
[45] Date of Patent: Sep. 12, 2000

[54] CHEMICAL MECHANICAL POLISH (CMP) ENDPOINT DETECTION BY COLORIMETRY

[75] Inventors: Mei-Sheng Zhou; Simon Chooi, both of Singapore, Singapore

[73] Assignee: Chartered Semiconductor Manufacturing Co., Singapore, Singapore

[21] Appl. No.: 08/902,847

[22] Filed: Jul. 30, 1997

[51] Int. Cl.[7] .................................... H01L 21/00
[52] U.S. Cl. ................ 438/692; 216/38; 216/84; 438/8; 438/14
[58] Field of Search .................. 438/8, 14, 16, 438/691, 692; 216/38, 84, 85, 88; 156/345 LC, 345 LP

[56] References Cited

U.S. PATENT DOCUMENTS

| | | | |
|---|---|---|---|
| 4,838,697 | 6/1989 | Kurandt | 356/406 |
| 5,234,868 | 8/1993 | Cote | 438/692 X |
| 5,240,552 | 8/1993 | Vu et al. | 156/636 |
| 5,337,015 | 8/1994 | Lustig et al. | 324/671 |
| 5,736,427 | 4/1998 | Henderson | 438/8 X |
| 5,736,462 | 4/1998 | Takahashi et al. | 438/692 |
| 5,798,302 | 8/1998 | Hudson et al. | |

*Primary Examiner*—William Powell
*Attorney, Agent, or Firm*—George O. Saile; Rosemary L.S. Pike; Alek P. Szecsy

[57] ABSTRACT

A method for fabricating a microelectronics fabrication. There is first provided a substrate employed within a microelectronics fabrication. There is then formed over the substrate a planarizable layer. The planarizable layer has a lower residual portion of the planarizable layer and an upper removable portion of the planarizable layer, where one of the lower residual portion of the planarizable layer and the upper removable portion of the planarizable layer has a colorant incorporated therein. The colorant is positioned at a location which assists in monitoring and controlling an endpoint of a chemical mechanical polish (CMP) planarizing method employed in planarizing the planarizable layer. There is then planarized through the chemical mechanical polish (CMP) planarizing method the planarizable layer while employing the colorant concentration to determine the endpoint of the chemical mechanical polish (CMP) planarizing method.

14 Claims, 3 Drawing Sheets

CHEMICAL MECHANICAL POLISH (CMP) ENDPOINT DETECTION BY COLORIMETRY

BACKGROUND OF THE INVENTION

1. Field of the Invention

The present invention relates generally to chemical mechanical polish (CMP) planarizing methods for planarizing planarizable layers within microelectronics fabrications. More particularly, the present invention relates to endpoint detection methods employed within chemical mechanical polish (CMP) planarizing methods for planarizing planarizable layers within microelectronics fabrications.

2. Description of the Related Art

Integrated circuit microelectronics fabrications are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

When forming within advanced integrated circuit microelectronics fabrications integrated circuit layers, such as but not limited to integrated circuit conductor layers, integrated circuit semiconductor layers and integrated circuit dielectric layers, it is common in the art of advanced integrated circuit microelectronics fabrication that those integrated circuit layers will be formed with substantial topography, since within advanced integrated circuit microelectronics fabrications increased integrated circuit device density is often achieved through forming high aspect ratio integrated circuit structures upon which are subsequently formed integrated circuit layers.

In order to provide within advanced integrated circuit microelectronics fabrications integrated circuit layers upon which there may subsequently be formed additional integrated circuit structures with enhanced functionality and reliability, it is common in the art of advanced integrated circuit microelectronics fabrication to planarize integrated circuit layers, and in particular to planarize integrated circuit dielectric layers, through chemical mechanical polish (CMP) planarizing methods.

While chemical mechanical polish (CMP) planarizing methods provide within advanced integrated circuit microelectronics fabrications planarized integrated circuit layers upon which there may be formed additional integrated circuit structures with enhanced functionality and reliability, the use of chemical mechanical polish (CMP) planarizing methods for forming planarized integrated circuit layers within advanced integrated circuit microelectronics fabrications is not entirely without problems.

In particular, it is recognized within the art of advanced integrated circuit microelectronics fabrication that it is often difficult to planarize to a reproducible thickness through a chemical mechanical polish (CMP) planarizing method within an advanced integrated circuit microelectronics fabrication an integrated circuit layer when there is not employed a polish stop layer when planarizing through the chemical mechanical polish (CMP) planarizing method the integrated circuit layer. Chemical mechanical polish (CMP) planarized integrated circuit layers with irreproducible thicknesses within advanced integrated circuit microelectronics fabrications are undesirable since they may compromise the functionality or reliability of the advanced integrated circuit microelectronics fabrications into which they are formed.

It is thus in general towards the goal of forming with reproducible thickness within advanced integrated circuit microelectronics fabrications chemical mechanical polish (CMP) planarized integrated circuit layers that the present invention is in part directed. To achieve this goal, it is thus also towards providing methods and materials for monitoring and controlling the endpoints within chemical mechanical polish (CMP) planarizing methods for planarizing integrated circuit layers within advanced integrated circuit microelectronics fabrications that the present invention is consequently also directed.

Various methods been disclosed in the art of integrated circuit microelectronics fabrication for monitoring and/or controlling endpoints of chemical mechanical polish (CMP) planarizing methods employed in planarizing integrated circuit layers within integrated circuit microelectronics fabrications. For example, Yu et al., in U.S. Pat. No. 5,240,552 discloses an acoustic wave reflection method for monitoring and controlling endpoints within chemical mechanical polish (CMP) planarizing methods employed within integrated circuit microelectronics fabrication. In addition, Lustig et al., in U.S. Pat. No. 5,337,015 discloses a leakage current method and apparatus for monitoring and controlling endpoints within chemical mechanical polish (CMP) planarizing methods employed within integrated circuit microelectronics fabrication.

Although not specifically related to monitoring or controlling endpoints within chemical mechanical polish (CMP) planarizing methods employed in planarizing integrated circuit layers within integrated circuit microelectronics fabrications, Kurandt, in U.S. Pat. No. 4,838,697, discloses an apparatus for rapid colorimetric determination of samples of various types. The apparatus employs several light emitting semiconductor photodiodes, as well as a singular photoreceiver.

Desirable in the art are additional methods for monitoring and controlling endpoints within chemical mechanical polish (CMP) planarizing methods employed in planarizing integrated circuit layers within integrated circuit microelectronics fabrications. Particularly desirable in the art are additional methods for monitoring and controlling endpoints within chemical mechanical polish (CMP) planarizing methods employed in planarizing integrated circuit dielectric layers within integrated circuit microelectronics fabrications. It is towards the foregoing objects that the present invention is more specifically directed.

SUMMARY OF THE INVENTION

A first object of the present invention is to provide a method for monitoring and controlling the endpoint within a chemical mechanical polish (CMP) planarizing, method employed in planarizing an integrated circuit layer within an integrated circuit microelectronics fabrication.

A second object of the present invention is to provide a method in accord with the first object of the present invention, where the integrated circuit layer is an integrated circuit dielectric layer.

A third object of the present invention is to provide a method in accord with the first object of the present invention or the second object of the present invention, which method is readily manufacturable.

In accord with the objects of the present invention, there is provided by the present invention a method for monitoring and controlling the endpoint within a chemical mechanical polish (CMP) planarizing method for planarizing an integrated circuit layer within an integrated circuit microelectronics fabrication. To practice the method of the present invention, there is first provided a semiconductor substrate. There is then formed over the semiconductor substrate an integrated circuit layer. The integrated circuit layer has a lower residual portion of the integrated circuit layer closer to the semiconductor substrate and an upper removable portion of the integrated circuit layer further spaced from the semiconductor substrate, where one of the lower residual portion of the integrated circuit layer and the upper removable portion of the integrated circuit layer has a colorant incorporated therein. The colorant is positioned at a location which assists in monitoring and controlling an endpoint of a chemical mechanical polish (CMP) planarizing method employed in planarizing the integrated circuit layer. There is then planarized through the chemical mechanical polish (CMP) planarizing method the integrated circuit layer while employing the colorant concentration to monitor and control the endpoint of the chemical mechanical polish (Cow) planarizing method.

The present invention provides a method for monitoring and controlling an endpoint within a chemical mechanical polish (CMP) planarizing method employed in planarizing an integrated circuit layer within an integrated circuit microelectronics fabrication. The method of the present invention achieves this object by employing a colorant within either a lower residual portion of the integrated circuit layer or an upper removable portion of the integrated circuit layer. Thus, when subsequently planarizing through the chemical mechanical polish (CMP) planarizing method the integrated circuit layer the colorant concentration may be employed to monitor and control the endpoint of the chemical mechanical polish (CMP) planarizing method.

The method of the present invention may be employed where the integrated circuit layer is an integrated circuit dielectric layer. The method of the present invention does not discriminate with respect to the nature of the integrated circuit layer, provided that there may be incorporated into either a lower residual portion of the integrated circuit layer or an upper removable portion of the integrated circuit layer a colorant. Thus, although the method of the present invention is more likely to provide value in monitoring and controlling an endpoint when chemical mechanical polish (CMP) planarizing an integrated circuit dielectric layer within an integrated circuit microelectronics fabrication, the method of the present invention may also be employed in monitoring and controlling endpoints within chemical mechanical polish (CMP) planarizing methods employed in planarizing within integrated circuit microelectronics fabrications integrated circuit layers including but not limited to integrated circuit conductor layers, integrated circuit semiconductor layers and integrated circuit dielectric layers.

Similarly, the method of the present invention is also not limited to monitoring and controlling endpoints within chemical mechanical polish (CMP) planarizing methods employed in chemical mechanical polish (CMP) planarizing integrated circuit layers within integrated circuits. In that regard, the method of the present invention may also be employed in monitoring and controlling endpoints within chemical mechanical polish (CMP) planarizing methods when planarizing planarizable layers within microelectronics fabrications including but not limited to integrated circuit microelectronics fabrications, solar cell microelectronics fabrications, ceramic packaging microelectronics fabrications and flat panel display microelectronics fabrications.

The method of the present invention is readily manufacturable. Disclosed within the Description of the Preferred Embodiment are methods and materials through which the method of the present invention may be employed in monitoring and controlling an endpoint when chemical mechanical polish (CMP) planarizing a dielectric layer within an integrated circuit microelectronics fabrication. Since the methods and materials so disclosed are either generally available or readily accessible within integrated circuit microelectronics fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for monitoring and controlling the endpoint of a chemical mechanical polish (CMP) planarizing method employed in planarizing an integrated circuit layer within an integrated circuit microelectronics fabrication. The method of the present invention realizes this object by incorporating within either a lower residual portion of the integrated circuit layer or an upper removable portion of the integrated circuit layer a colorant, where the colorant is positioned at a location which assists in monitoring and controlling an endpoint of a chemical mechanical polish (CMP) planarizing method employed in planarizing the integrated circuit layer. The integrated circuit layer may then be planarized through the chemical mechanical polish (CMP) planarizing method while employing the colorant concentration to monitor and control the endpoint of the chemical mechanical polish (CMP) planarizing method.

Although the preferred embodiment of the method of the present invention illustrates the method of the present invention employed in monitoring and controlling the endpoint when chemical mechanical polish (CMP) planarizing an integrated circuit dielectric layer within an integrated circuit microelectronics fabrication, the method of the present invention may also be employed in planarizing layers other than dielectric layers within microelectronics fabrications other than integrated circuit microelectronics fabrications. In that regard, the method of the present invention may be employed in planarizing planarizable layers including but not limited to planarizable conductor layers, planarizable semiconductor layers and planarizable dielectric layers within microelectronics fabrications including but not limited to integrated circuit microelectronics fabrication, solar cell microelectronics fabrications, ceramic packaging microelectronics fabrications and flat panel display microelectronics fabrications.

Figure 1:
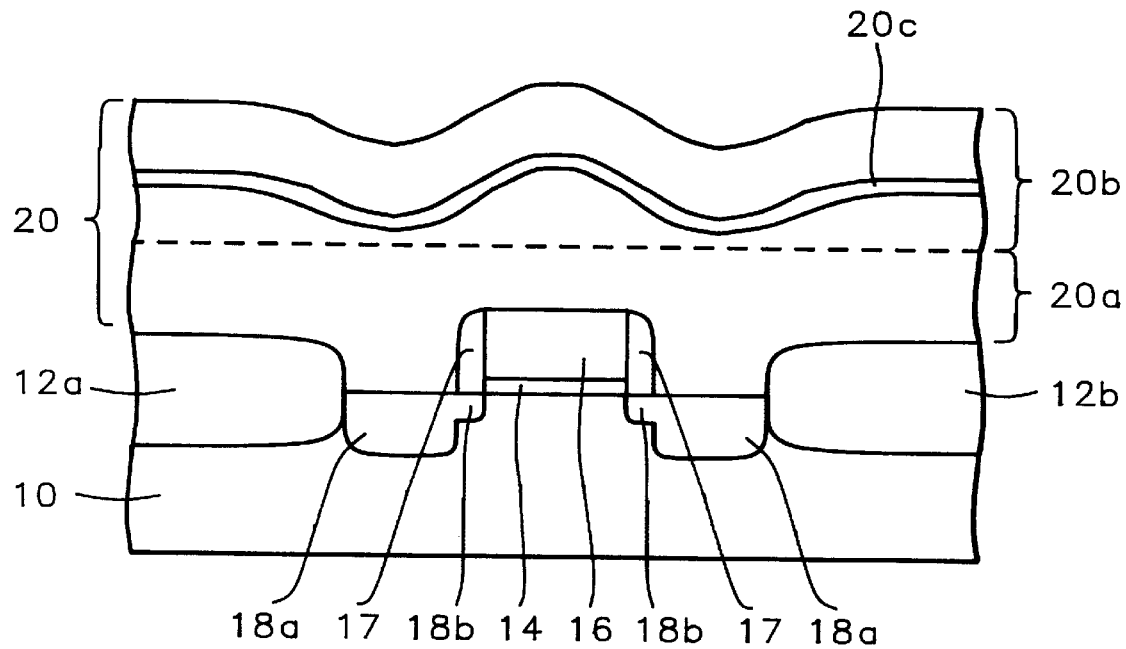
FIG. 1 to FIG. 4 show a series of schematic cross-sectional diagrams illustrating the results of progressive stages of forming an integrated circuit microelectronics fabrication having formed therein two dielectric layers which are planarized through a chemical mechanical polish (CMP) planarizing method whose endpoint is monitored and controlled in accord with the preferred embodiment of the method of the present invention.

Referring now to FIG. 1 to FIG. 4, there is shown a series of schematic cross-sectional diagrams illustrating the results of forming through a chemical mechanical polish (CMP) planarizing method within an integrated circuit microelectronics fabrication a pair of planarized dielectric layers, where the endpoint within the chemical mechanical polish (CMP) planarizing method when forming the pair of planarized dielectric layers is monitored and controlled in accord with the preferred embodiment of the method of the present invention. Shown in FIG. 1 is a schematic cross-sectional diagram of the integrated circuit microelectronics fabrication at an early stage in its fabrication.

Shown in FIG. 1 is a semiconductor substrate 10 having formed therein and thereupon a pair of isolation regions 12a and 12b which define an active region of the semiconductor substrate 10. Although it is known in the art of integrated circuit microelectronics fabrication that semiconductor substrates are available with either dopant polarity, various dopant concentrations and several crystallographic orientations, for the preferred embodiment of the method of the present invention the semiconductor substrate 10 is preferably a (100) silicon semiconductor substrate having an N- or P- doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the preferred embodiment of the method of the present invention the isolation regions 12a and 12b are preferably formed within and upon the semiconductor substrate 10 through an isolation region thermal growth method at a temperature of from about 1000 to about 1200 degrees centigrade to form isolation regions 12a and 12b of silicon oxide within and upon the semiconductor substrate 10.

Shown also within FIG. 1 formed within and upon the active region of the semiconductor substrate 10 is a field effect transistor (FET) which comprise a series of structures including: (1) a gate dielectric layer 14 formed upon the active region of the semiconductor substrate 10, the gate dielectric layer 14 having formed and aligned thereupon; (2) a gate electrode 16; (3) a pair of dielectric spacer layers 17 formed adjacent a pair of opposite edges of the gate dielectric layer 14 and the gate electrode 16; and (4) a pair of source/drain regions 18a and 18b formed within the active region of the semiconductor substrate 10. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed through methods including but not limited to blanket gate dielectric layer thermal oxidation methods and blanket gate dielectric layer deposition/patterning methods, for the preferred embodiment of the method of the present invention the gate dielectric layer 14 is preferably formed through patterning, through methods as are conventional in the art, of a blanket gate dielectric layer formed through a thermal oxidation method at a temperature of from about 700 to about 1000 degrees centigrade to form the blanket gate dielectric layer of silicon oxide of thickness about 20 to about 150 angstroms upon the active region of the semiconductor substrate 10.

Similarly, although it is also known in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the preferred embodiment of the method of the present invention the gate electrode 16 is preferably formed through patterning, through methods as are conventional in the art, of a blanket layer of a doped polysilicon or polycide gate electrode material layer formed upon the blanket gate dielectric to a thickness of from about 200 to about 5000 angstroms.

Still yet similarly, although it is also known in the art of field effect transistor (FET) fabrication that dielectric spacer layers may be formed within field effect transistors (FETs) within integrated circuit microelectronics fabrications through anisotropic reactive ion etching methods through which are formed dielectric spacer layers of dielectric materials including but not limited to silicon oxide dielectric materials, silicon nitride dielectric materials and silicon oxynitride dielectric materials, for the preferred embodiment of the method of the present invention the dielectric spacer layers 17 are preferably formed through an anisotropic reactive ion etch (RIE) method, high density plasma (HDP) etch method or electron cyclotron resonance (ECR) etch method, as is conventional in the art of field effect transistor (FET) fabrication, to form the dielectric spacer layers 17 from a blanket layer of a silicon oxide dielectric material formed through a plasma enhanced chemical vapor deposition (PECVD) method. Preferably, the plasma enhanced chemical vapor deposition (PECVD) method employs silane as a silicon source material.

Finally, it is also known in the art of field effect transistor (FET) fabrication that source/drain regions are typically formed through ion implantation methods employing dopant ions of polarity opposite the polarity of the semiconductor substrate within which is formed those source/drain regions. For the preferred embodiment of the method of the present invention, the pairs of source/drain regions 18a and 18b are preferably formed within the active region of the semiconductor substrate 10 through a low dose ion implant of from about IE15 to about IE17 ions per square centimeter and about 0.1 to about 200 keV while employing the gate electrode 16 and the gate dielectric layer 14 as an ion implantation mask followed by a high dose ion implant of from about IE15 to about IE17 dopant ions per square centimeter and about 0.1 to about 200 keV while employing the gate electrode 16, the gate dielectric layer 14 and the dielectric spacer layers 17 as an ion implantation mask. The low dose ion implant and the high dose ion implant are of polarity appropriate to the field effect transistor (FET) and the semiconductor substrate 10.

There is also shown in FIG. 1 formed upon the semiconductor substrate 10 and the series of structures which forms the field effect transistor (FET) a series of three layers which in the aggregate form a pre-metal dielectric (PMD) layer 20. Within the pre-metal dielectric (PMD) layer 20 there is: (1) a lower residual portion of the pre-metal dielectric (PMD) layer 20a closer to the semiconductor substrate 10; and (2) an upper removable portion of the pre-metal dielectric (PMD) layer 20b further removed from the semiconductor substrate 10. As is illustrated within FIG. 1, there is also incorporated within the upper removable portion of the pre-metal dielectric (PMD) layer 20b a first colorant layer 20c, the lower portions of which terminate slightly above the lower residual portion of the pre-metal dielectric (PMD) layer 20a.

Methods and materials through which pre-metal dielectric (PMD) layers may be formed within integrated circuit microelectronics fabrications are generally known in the art of integrated circuit microelectronics fabrication. Pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods through which may be formed pre-metal dielectric (PMD) layers of dielectric materials including but not limited to silicon oxide dielectric materials, silicon nitride dielectric materials and silicon oxynitride dielectric materials. For the preferred embodiment of the method of the present invention, the portions of the pre-metal dielectric (PMD) layer 20 other than the first colorant layer 20c are preferably formed of a silicon oxide dielectric material deposited through a plasma enhanced chemical vapor deposition (PECVD) method, as is common in the art of integrated circuit microelectronics fabrication, although other methods and materials may also be employed in forming the portions of the pre-metal dielectric (PMD) layer 20 other than the first colorant layer 20c. Preferably, the pre-metal dielectric (PMD) layer 20 is from about 3000 to about 30000 angstroms thick, where the lower residual portion of the pre-metal dielectric (PMD) layer 20a is from about 1000 to about 10000 angstroms thick, while the upper removable portion of the pre-metal dielectric (PMD) layer 20b, including the first colorant layer 20c, is from about 2000 to about 20000 angstroms thick.

Figure 5A:
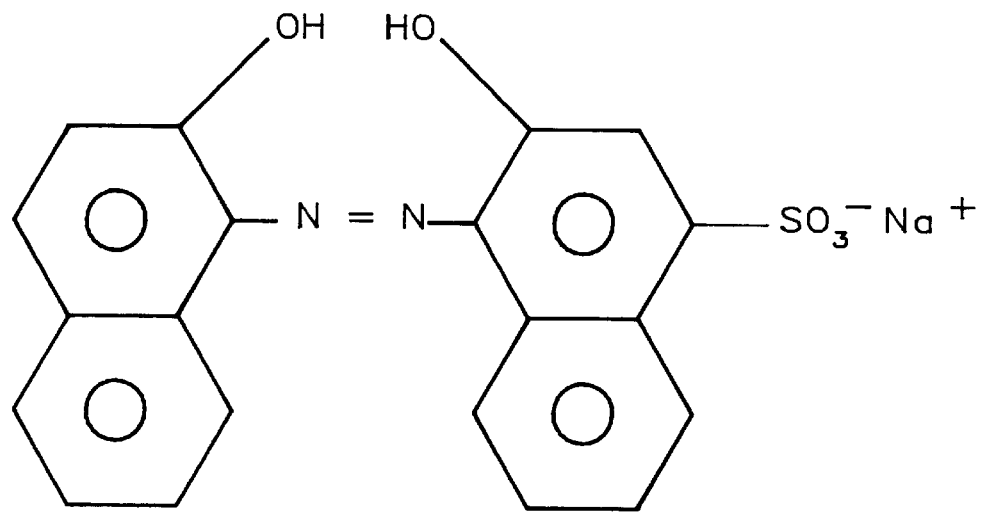
FIG. 5a and FIG. 5b show a pair of chemical structures corresponding with a pair of organic azo dye materials, either of which may be employed within a colorant layer employed within the preferred embodiment of the method of the present invention.
Figure 5B:
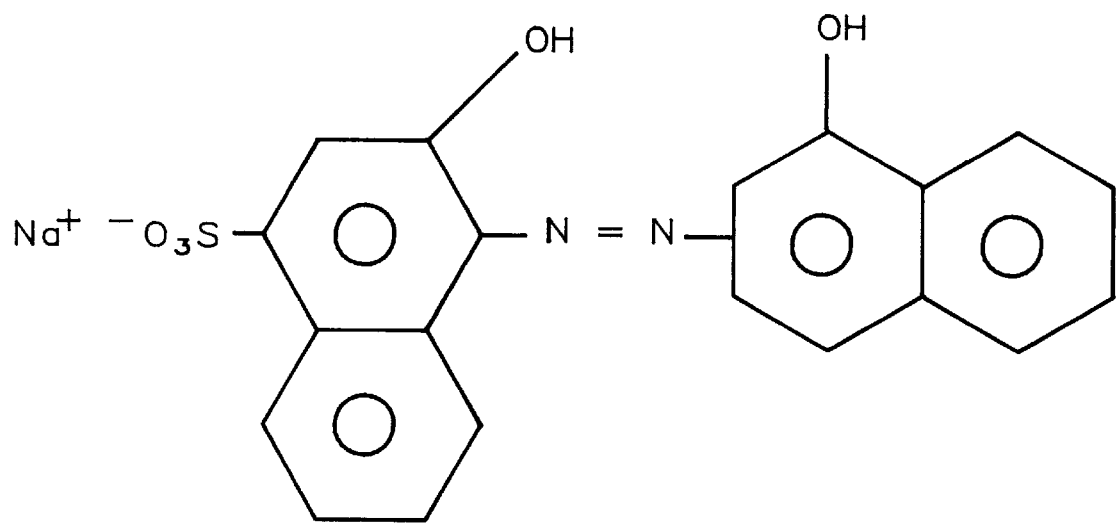

With regard to the first colorant layer 20c, colorant layers are not generally known in the art of integrated circuit microelectronics fabrication, and thus the presence and placement of the first colorant layer 20c within the integrated circuit microelectronics fabrication whose schematic cross-sectional diagram is illustrated in FIG. 1 provides in part a key feature related to the preferred embodiment of the method of the present invention. Although other colorant materials are not precluded by the method of the present invention, with respect to the preferred embodiment of the method of the present invention it is preferred that the first colorant layer 20c is comprised of an organic azo dye incorporated into a spin-on-glass (SOG) material which is subsequently spun and cured to form the first colorant layer 20c. Preferably, the organic azo dye has a decomposition/ decolorization temperature greater than the deposition temperature employed in forming the portions of the pre-metal dielectric (PMD) layer 20 other than the first colorant layer 20c. Representative, but not exclusive, organic azo dyes which may be employed within the preferred embodiment of the method of the present invention are shown in FIG. 5a and FIG. 5b. Within FIG. 5a there is shown the chemical structure of Solochrome Dark Blue/Calcon and within FIG. 5b there is shown the chemical structure of Eriochrome Blue Black B.

With respect to the spin-on-glass (SOG) material which is employed as a carrier material for the colorant material within the preferred embodiment of the method of the present invention, any of several spin-on-glass (SOG) materials, including but not limited to silicate spin-on-glass (SOG) materials, siloxane spin-on-glass (SOG) materials and silsesquioxane spin-on-polymer materials may be employed within the preferred embodiment of the method of the present invention. Within the preferred embodiment of the method of the present invention, the organic azo dye material is preferably incorporated into the spin-on-glass (SOG) material at a concentration of about 0.1 to about 5 grams organic azo dye material per 100 ml spin-on-glass (SOG) material. The organic azo dye/spin-on-glass (SO) solution or mixture is then spun and cured to form the colorant layer 20c of thickness about 500 to about 4000 angstroms.

Although not specifically illustrated by the schematic cross-sectional diagram of FIG. 1, there may alternatively be employed within the method of the present invention a colorant material more uniformly distributed within the upper removable portion of the pre-metal dielectric (PMD) layer 20b or a colorant material more uniformly distributed within the lower residual portion of the pre-metal dielectric (PMD) layer 20a. However, due to integrated circuit processing efficiency considerations, it is preferred within the method of the present invention to employ a discrete colorant layer, such as the first colorant layer 20c.

Figure 2:
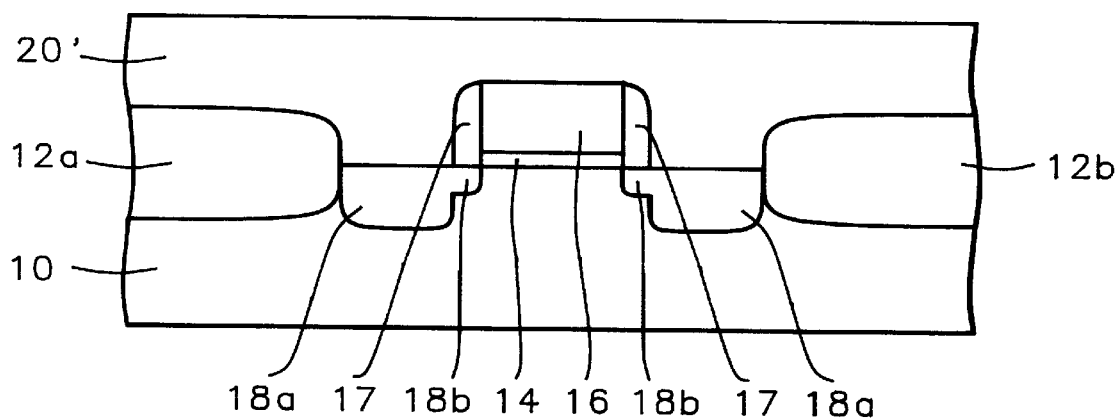

Referring now to FIG. 2, there is shown a schematic cross-sectional diagram illustrating the results of further processing of the integrated circuit microelectronics fabrication whose schematic cross-sectional diagram is illustrated in FIG. 1. Shown in FIG. 2 is the results of planarizing through a chemical mechanical polish (CMP) planarizing method the pre-metal dielectric (PMD) layer 20 to form the planarized pre-metal dielectric (PMD) layer 20'. The chemical mechanical polish (CMP) planarizing method employed in forming from the pre-metal dielectric (PMD) layer 20 as illustrated in FIG. 1 the planarized pre-metal dielectric (PMD) layer 20' as illustrated in FIG. 2 is otherwise conventional in the art of integrated circuit microelectronics fabrication. Preferably, the chemical mechanical polish (CMP) planarizing method employs: (1) a head or top ring pressure of from about 4.5 to about 10 pounds per square inch (psi); (2) a platen or head rotation speed of from about 20 to about 30 revolutions per minute (rpm); (3) an aqueous silica slurry at a concentration of from about 5 to about 50 weight percent silica and at a flow rate of from about 50 to about 500 cubic centimeters per minute (ccm); and (4) a semiconductor substrate 10 temperature of from about 20 to about 30 degrees centigrade. Preferably, the pre-metal dielectric (PMD) layer 20 is chemical mechanical polish (CMP) planarized to form the planarized pre-metal dielectric (PMD) layer 20' until the colorant layer 20c is completely polished from the surface of the integrated circuit microelectronics fabrication whose schematic cross-sectional diagram is illustrated in FIG. 1 to yield the integrated circuit microelectronics fabrication whose schematic cross-sectional diagram is illustrated in FIG. 2. In so doing, there will be a discharge of the first colorant layer 20c. For the preferred embodiment of the method of the present invention, the discharge of the first colorant layer 20c is preferably monitored through a colorimetric analysis of the outflow of spent silica slurry solution employed within the chemical mechanical polish (CMP) planarizing method employed in forming from the integrated circuit microelectronics fabrication whose schematic cross-sectional diagram is illustrated in FIG. 1 the integrated circuit microelectronics fabrication whose schematic cross-sectional diagram is illustrated in FIG. 2. However, as is understood by a person skilled in the art, there may be employed alternative colormetric analyses within the context of the method of the present invention. Such colormetric analyses will typically include, but are not limited to, colorimetric analyses of wafer surfaces during the time during which wafers are being chemical mechanical polish (CMP) planarized through the method of the present invention.

Figure 3:
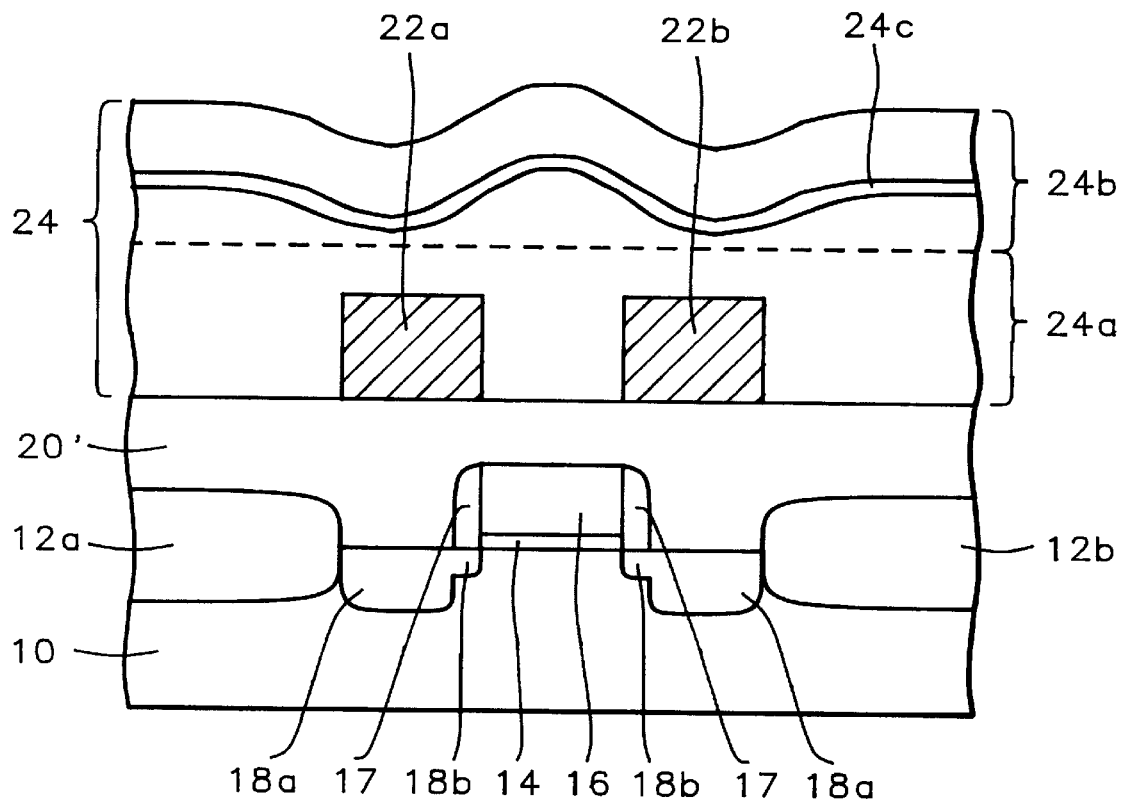

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein: (1) there is formed upon the planarized pre-metal dielectric (PMD) layer 20' a pair of patterned conductor layers 22a and 22b; and (2) there is formed upon the planarized pre-metal dielectric (PMD) layer 20' and the pair of patterned conductor layers 22a and 22b an inter-metal dielectric (IMD) layer 24. The inter-metal dielectric (IMD) layer 24 comprises a lower residual portion of the inter-metal dielectric (IMD) layer 24a and an upper removable portion of the inter-metal dielectric layer 24b, where the upper removable portion of the inter-metal dielectric (IMD) layer 24b has formed therein a second colorant layer 24c.

Methods and materials through which patterned conductor layers may be formed within integrated circuits are generally known within the art of integrated circuit microelectronics fabrication. Patterned conductor layers may be formed within integrated circuit microelectronics fabrications through methods including but not limited to thermally assisted evaporation methods, electron beam assisted evaporation methods, chemical vapor deposition (CVD) methods and physical vapor deposition (PVD) sputtering methods through which may be formed patterned conductor layers of conductor materials including but not limited to metals, metal alloys, doped polysilicon and polycides (doped polysilicon/metal suicide stacks). For the preferred embodiment of the method of the present invention, the patterned conductor layers 22a and 22b are preferably formed at least in part of an aluminum, titanium and titanium nitride containing conductor material, formed upon the planarized pre-metal dielectric (PMD) layer 20' to a thickness of from about 5000 to about 10000 angstroms each.

For the preferred embodiment of the method of the present invention, the inter-metal dielectric (IMD) layer 24 is preferably formed through methods, materials and dimensions analogous or equivalent to the methods, materials and dimensions employed in forming the pre-metal dielectric (PMD) layer 20 as illustrated in FIG. 1. In particular, the second colorant layer 24c incorporated within the upper removable portion of the inter-metal dielectric (IMD) layer 24b as illustrated in FIG. 3 is preferably formed through methods, materials and dimensions analogous or equivalent to the methods, materials and dimensions employed in forming the first colorant layer 20c incorporated within the upper removable portion of the pre-metal dielectric (PMD) layer 20b as illustrated within the integrated circuit microelectronics fabrication whose schematic cross-sectional diagram is illustrated in FIG. 1.

Figure 4:
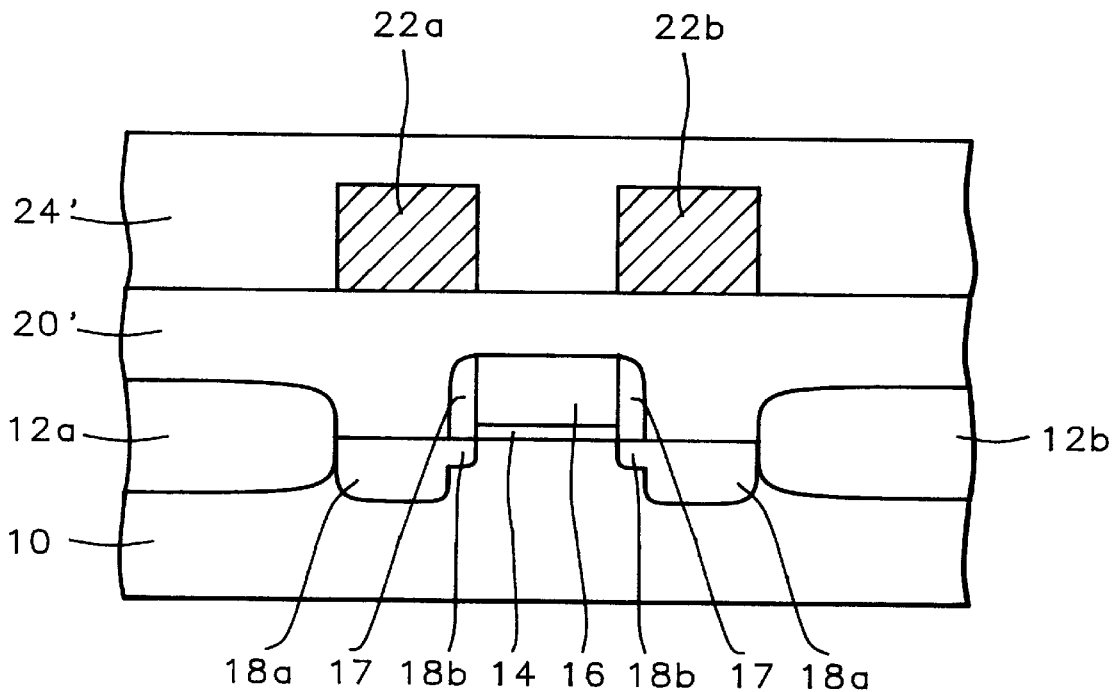

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein the inter-metal dielectric (IMD) layer 24 has been planarized through a chemical mechanical polish (CMP) planarizing method to form the planarized inter-metal dielectric layer 24'.

Within the preferred embodiment of the method of the present invention, the chemical mechanical polish (CMP) planarizing method through which inter-metal dielectric layer 24 as illustrated in FIG. 3 is planarized to form the planarized inter-metal dielectric (IMD) layer 24' as illustrated in FIG. 4 is preferably provided employing materials and parameters analogous or equivalent to the materials and parameters employed within the chemical mechanical polish (CMP) planarizing method through which the pre-metal dielectric (PMD) layer 20 as illustrated in FIG. 1 is planarized to form the planarized pre-metal dielectric (PMD) layer 20' as illustrated in FIG. 2. In particular, the inter-metal dielectric (IMD) layer 24 is planarized to form the planarized inter-metal dielectric (IMD) layer 24' while discharging the second colorant layer 24c.

Upon forming from the integrated circuit microelectronics fabrication whose schematic cross-sectional diagram is illustrated in FIG. 3 the integrated circuit microelectronics fabrication whose schematic cross-sectional diagram is illustrated in FIG. 4, there is formed an integrated circuit microelectronics fabrication having formed therein two planarized dielectric layers which have been planarized through a chemical mechanical polish (CMP) planarizing method in accord with the preferred embodiment of the method of the present invention. The two planarized dielectric layers so formed provide the integrated circuit microelectronics fabrication so formed with enhanced functionality and reliability since the planarized dielectric layers so formed are formed with reproducible thicknesses.

As is understood by a person skilled in the art, the preferred embodiment of the method of the present invention is illustrative of the method of the present invention rather than limiting of the method of the present invention. Revisions and modifications may be made to materials, structures and dimensions through which is practiced the preferred embodiment of the method of the present invention while still providing embodiments which are within the spirit and scope of the present invention, as defined by the accompanying claims.

What is claimed is:

1. A method for fabricating a microelectronics fabrication comprising:

providing a substrate employed within a microelectronics fabrication;

forming over the substrate a planarizable layer, the planarizable layer having a lower residual portion of the planarizable layer closer to the substrate and an upper removable portion of the planarizable layer further spaced from the substrate, where one of the lower residual portion of the planarizable layer and the upper removable portion of the planarizable layer has a colorant incorporated therein, the colorant being positioned at a location which assists in monitoring and controlling an endpoint of a chemical mechanical polish (CMP) planarizing method employed in planarizing the planarizable layer; and planarizing through the chemical mechanical polish (CMP) planarizing method the planarizable layer while employing the colorant concentration to monitor and control the endpoint of the chemical mechanical polish (CMP) planarizing method.

2. The method of claim 1 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

3. The method of claim 1 wherein the planarizable layer is chosen from the group of planarizable layers consisting of planarizable conductor layers, planarizable semiconductor layers and planarizable insulator layers.

4. A microelectronics fabrication having fabricated therein a planarized planarizable layer formed in accord with the method of claim 1.

5. A method for fabricating an integrated circuit microelectronics fabrication comprising:

providing a semiconductor substrate employed within an integrated circuit microelectronics fabrication;

forming over the semiconductor substrate a planarizable layer, the planarizable layer having a lower residual portion of the planarizable layer closer to the semiconductor substrate and an upper removable portion of the planarizable layer further spaced from the semiconductor substrate, where one of the lower residual portion of the planarizable layer and the upper removable portion of the planarizable layer has a colorant incorporated therein, the colorant being positioned at a location which assists in monitoring and controlling an endpoint of a chemical mechanical polish (CMP) planarizing method employed in planarizing the planarizable layer; and planarizing through the chemical mechanical polish (CMP) planarizing method the planarizable layer while employing the colorant concentration to monitor and control the endpoint of the chemical mechanical polish (CMP) planarizing method.

6. The method of claim 5 wherein the planarizable layer is chosen from the group of planarizable layers consisting of planarizable conductor layers, planarizable semiconductor layers and planarizable insulator layers.

7. An integrated circuit microelectronics fabrication having fabricated therein a planarized planarizable layer formed in accord with the method of claim 6.

8. A method for fabricating an integrated circuit microelectronics fabrication comprising:

providing a semiconductor substrate employed within an integrated circuit microelectronics fabrication;

forming over the substrate a planarizable dielectric layer, the planarizable dielectric layer having a lower residual portion of the planarizable dielectric layer closer to the semiconductor substrate and an upper removable portion of the planarizable dielectric layer further spaced from the semiconductor substrate, where one of the lower residual portion of the planarizable dielectric layer and the upper removable portion of the planarizable dielectric layer has a colorant incorporated therein, the colorant being positioned at a location which assists in monitoring and controlling an endpoint of a chemical mechanical polish (CMP) planarizing method employed in planarizing the planarizable dielectric layer; and planarizing through the chemical mechanical polish (CMP) planarizing method the planarizable dielectric layer while employing the colorant concentration to monitor and control the endpoint of the chemical mechanical polish (CMP) planarizing method.

9. The method of claim 8 wherein the planarizable dielectric layer is chosen from the group of planarizable dielectric layers consisting of planarizable silicon oxide dielectric layers, planarizable silicon nitride dielectric layers and planarizable silicon oxynitride dielectric layers.

10. The method of claim 8 wherein the planarizable dielectric layer is a planarizable silicon oxide dielectric layer.

11. The method of claim 10 wherein the colorant is chosen from the group of colorant materials consisting of organic azo dye colorant materials.

12. The method of claim 11 wherein the colorant is incorporated into the upper removable portion of the planarizable dielectric layer.

13. The method of claim 12 wherein the colorant concentration is monitored within the chemical mechanical polish (CMP) slurry residue.

14. An integrated circuit microelectronics fabrication having incorporated therein a planarized dielectric layer formed in accord with the method of claim 8.

* * * * *